(12) United States Patent
Kim et al.

(10) Patent No.: US 8,216,762 B2
(45) Date of Patent: Jul. 10, 2012

(54) METHOD FOR MANUFACTURING ARRAY BOARD FOR DISPLAY DEVICE

(75) Inventors: Byoung-Kee Kim, Yongin-si (KR);
Se-Hyung Park, Seongnam-si (KR);
Dal-Seok Byun, Seoul (KR);
Seog-Jeong Song, Yongin-si (KR);
Jong-Min Park, Anyang-si (KR)

(73) Assignee: Kolon Industries, Inc., Kwacheon-si (KR)

( * ) Notice: Subject to any disclaimer, the term of this patent is extended or adjusted under 35 U.S.C. 154(b) by 275 days.

(21) Appl. No.: 11/814,899

(22) PCT Filed: Feb. 1, 2006

(86) PCT No.: PCT/KR2006/000349
§ 371 (c)(1),
(2), (4) Date: Jul. 26, 2007

(87) PCT Pub. No.: WO2006/083104
PCT Pub. Date: Aug. 10, 2006

(65) Prior Publication Data
US 2008/0135842 A1 Jun. 12, 2008

(30) Foreign Application Priority Data
Feb. 2, 2005 (KR) .................. 10-2005-0009530

(51) Int. Cl.
*G02F 1/136* (2006.01)
*G02F 7/26* (2006.01)
*H01L 25/07* (2006.01)

(52) U.S. Cl. .............. 430/270.1; 430/191; 430/192; 430/193; 430/326; 257/59; 257/E27.081

(58) Field of Classification Search .......... 257/59, 257/E27.081; 430/326, 281.1, 270.1, 191, 430/192, 193
See application file for complete search history.

(56) References Cited

U.S. PATENT DOCUMENTS

| | | | |
|---|---|---|---|
| 4,845,008 A * | 7/1989 | Nishioka et al. | 430/165 |
| 6,132,939 A * | 10/2000 | Ina | 430/325 |
| 6,376,271 B1 * | 4/2002 | Sawayama et al. | 438/30 |
| 6,396,559 B1 | 5/2002 | Kishimoto et al. | |
| 7,449,280 B2 * | 11/2008 | Johnson et al. | 430/280.1 |
| 2003/0087179 A1 * | 5/2003 | Iwasaki | 430/166 |

FOREIGN PATENT DOCUMENTS

| | | |
|---|---|---|
| JP | 60-24545 A | 2/1985 |
| JP | 62-194249 A | 8/1987 |
| JP | 62-251739 A | 11/1987 |
| JP | 2-502312 A | 7/1990 |
| JP | 3-280588 A | 12/1991 |
| JP | 5-107760 A | 4/1993 |

(Continued)

*Primary Examiner* — N Drew Richards
*Assistant Examiner* — John P Dulka
(74) *Attorney, Agent, or Firm* — Birch, Stewart, Kolasch & Birch, LLP

(57) ABSTRACT

An array for a display device is formed by adhering a positive dry film resist, which has a positive photoresist resin layer over a supporting film, to a substrate such that the photoresist resin layer adheres on a surface of the substrate. The supporting film is then released from the photoresist resin layer adhered to the surface of the substrate, the layer is exposed to light; and the positive type photoresist layer is developed to remove exposed regions.

15 Claims, 3 Drawing Sheets

FOREIGN PATENT DOCUMENTS

| | | |
|---|---|---|
| JP | 6-95369 A | 4/1994 |
| JP | 6-102662 A | 4/1994 |
| JP | 8-99952 A | 4/1996 |
| JP | 8-305014 A | 11/1996 |
| JP | 10-69075 A | 3/1998 |
| JP | 11-142829 A | 5/1999 |
| JP | 2000-214470 A | 8/2000 |
| JP | 2001-75090 A | 3/2001 |
| JP | 2001-100221 A | 4/2001 |
| JP | 2002-49043 A | 2/2002 |
| JP | 2002-341525 A | 11/2002 |
| KR | 2001-0007536 A | 1/2001 |
| WO | WO 89/05475 * | 6/1989 |
| WO | 99/32936 A1 | 7/1999 |

* cited by examiner

METHOD FOR MANUFACTURING ARRAY BOARD FOR DISPLAY DEVICE

TECHNICAL FIELD

A method for manufacturing an array board for a display device and the utilization of a positive type photoresist resin in manufacturing an array board for a display device.

BACKGROUND ART

Flat display devices are increasingly being developed to replace cathode ray tube (CRT) devices. Among these, liquid crystal display devices (LCDs), organic electroluminescent displays (ELDs) and the like have particularly come to attention, which have advantages such as light weight, thin film properties, or low power consumption, etc.

For example, a light transmission active matrix type liquid crystal display device may include an array of display pixels with each having a switching element. The active matrix type liquid crystal display device has a liquid crystal layer disposed between an array substrate and an opposite substrate through an alignment layer.

The array substrate has multiple signal lines and scanning lines aligned in lattices formed on a transparent board made of glass, quartz, etc. Each of the lattices is connected to a thin film transistor (hereinafter, abbreviated to TFT) using amorphous silicon semiconductor thin films at crossing points of the lattices.

Gate electrodes and drain electrodes of the TFT are electrically connected to the scanning lines and the signal lines, respectively, while source electrodes of the TFT are electronically connected to transparent conductive materials for use in fabrication of pixel electrodes, for example, indium-tin-oxide (ITO).

Possible structures of TFTs include positive stagger type (top gate type) and negative stagger type (bottom gate type) structures.

Photoresists and photoresist films are utilized in the manufacture of these LCDs and are also used to manufacture other highly integrated semiconductors such as integrated circuits (ICs), printed circuit boards (PCBs) and electronic display devices such as cathode ray tubes (CRTs), and organic electroluminescent displays (ELs or ELDs). The manufacturing processes for these devices use photolithography and photofabrication techniques. The photoresist films require a resolution sufficient to form a pattern with extremely fine lines and small space area not more than 7 μm.

The physical properties of photoresists can vary in such characteristics as solubility in a certain solvents, coloration, curing and the like, via chemical modification of the molecular structure of the photoresist resin or the photoresist.

In recent years, processes for manufacturing TFT-LCDs using the liquid photoresist compositions have become increasingly complicated and difficult as substrate sizes are increasing, and the problems associated with liquid photoresist compositions have become more marked. Positive liquid photoresists exhibit problems such as reduced resolution and sensitivity due to sedimentation during storage, inferior pattern design due to residues on a coated surface, etc. Therefore, there exists a need to develop novel photoresists to solve such problems.

The desire for positive dry resist technology arose from the disadvantages associated with conventional liquid positive photoresists. These disadvantages led to elevated process costs. For example, spin coating a photoresist onto a semiconductor wafer results in losses of expensive photoresist material. The machinery for spin coating resists represents a substantial capital expense, and the time and management associated with spin coating results in additional process expense. The filtration associated with point-of-use application of photoresists is also cost-intensive. The wastage of photoresists at all points in the spin coating process also represents a substantial part of the photoresist cost. Also, positive liquid photoresist compositions generate insoluble materials (that is, undergoes sedimentation) during storage, leading to reduction of resolution and sensitivity. As a result, a practical dry film positive photoresist technology becomes highly desirable.

Conventional dry film photoresist technology began development during the 1960's when liquid negative photoresists were adapted to dry film technology for the manufacture of large featured, low resolution devices such as printed circuit board (PCB) patterns. However, the poor resolution of these negative dry film resists inhibited the application of dry film technology to high resolution applications such as ICs, LCDs etc.

Positive dry film resists first emerged during the 1980's, where technologies developed that exploited the properties of thermoplastic resins. For example, cellulose resins were utilized as the basis of dry film positive resists (U.S. Pat. No. 5,981,135). Additional dry film positive resists were developed by DuPont (U.S. Pat. Nos. 4,193,797 and 5,077,174), which were based upon acrylate or methacrylate resins. These related art thermoplastic positive dry film photoresists thus shared the disadvantages of the negative resists because utilizing cellulosic or acrylic resins yield a thick dry film photoresist that has low resolution.

As a result, application of these related art dry film positive photoresists has proven problematic in regards to the thin films required for advanced semiconductor manufacturing applications. That is, as the photoresist layer widths necessarily become thinner for high resolution photolithography, the requirement for a uniform thin film increases. For example, a thin film of photoresist is more sensitive to external phenomena such as substrate roughness. A sufficiently non-uniform substrate can cause defects in the photoresist layer such as "fish eye".

Also, the physical properties of the photoresist resin or the photoresist can be altered, such as alteration in solubility in a certain solvent (that is, increase or decrease in solubility), coloration, curing and the like, via chemical modification of the molecular structure of the photoresist resin or the photoresist caused in a short time by an optical device.

Additionally, a variety of solvents used to improve physical properties and working stability of a photoresist resin composition have been developed and include, for example, ethyleneglycol monoethylether acetate (EGMEA), propyleneglycol monoethylether acetate (PGMEA), ethyl acetate (EA) and the like.

However, these liquid photoresist compositions generate insoluble materials (that is, undergoes sedimentation) during storage, leading to reduction of resolution and sensitivity. For example, a composition comprising alkali soluble novolac resin and, as a photoacid generator, a material containing 1,2-naphthoquinonediazido-4-sulfonic ester and acid decomposable radicals as disclosed in Japanese Patent Laid-Open No. 3-249654, and a composition comprising alkali soluble novolac resin, 1,2-naphthoquinonediazido-4-sulfonic polyhydroxybenzophenone ester and acid decomposable radicals as disclosed in Japanese Patent Laid-Open No. 6-202320 have problems such as reduced resolution and sensitivity due to sedimentation during storage, inferior pattern design due to residues on a coated surface, etc.

Another Example of the related art technology includes U.S. Pat. No. 3,666,473, which pertains to the use of a mixture of two kinds of phenol-formaldehyde novolac resins and a typical photosensitive compound. U.S. Pat. No. 4,115,128 discusses the addition of an organic acid cyclic anhydride to phenol resin and a naphthoquinone diazide sensitizer to improve photosensitizing speed thereof. U.S. Pat. No. 4,550,069 discusses the use of novolac resin, an o-quinone azide photosensitive compound and propyleneglycol monoethyl-ether acetate (PGMEA) as a solvent for the same to increase photosensitizing speed and to improve human toxicity. Japanese Patent No. 189,739 is directed to fractionation of novolac resin to increase resolution and thermal resistance.

Consequently, there is a strong need in the art for a display manufacturing technology that utilizes an improved photoresist resin product that overcomes various problems such as thickness deviation of the coating layer, poor smoothness, distortion, coagulation, foaming, coating loss and the like, which are caused during necessary processes such as spin-coating or similar process in formation of micro-patterns on LCDs, organic ELDs and the like using conventional liquid positive type photoresist compositions. The technology should concurrently exhibit high resolution, excellent line width control ability, high thermal resistance, high sensitivity, high film residual rate, high dry etching resistance and high development properties; and be applicable to micro-fine processing of LCDs, organic ELDs and the like.

DISCLOSURE OF INVENTION

Technical Problem

Accordingly, it is an object of the invention, in part, to provide a method for forming an array using positive type photoresist resin film which can solve the above problems by eliminating complicated application processes (for example, spin-coating) on a glass substrate required when a related art liquid photoresist composition is used to form micro-circuit patterns on a substrate for a TFT-LCD, an organic ELD and the like.

The invention, in part, pertains to a method for manufacturing an array for a display device that includes adhering a positive dry film resist, which has a positive photoresist resin layer over a supporting film, to a substrate such that the photoresist resin layer adheres on a surface of the substrate; releasing the supporting film from the photoresist resin layer adhered to the surface of the substrate; exposing the layer to light; and developing and removing exposed regions in the positive type photoresist resin layer.

The invention, in part, pertains to an array manufactured using a photoresist resin film having a supporting film and a positive type photoresist resin layer laminated over the supporting film. More particularly, the positive type photoresist resin layer includes an alkali soluble resin, a diazide based photosensitive compound, a sensitivity enhancer, a high-boiling point solvent having a boiling point sufficiently high such that a second solvent can be removed from the composition by heating while the first solvent is substantially retained in the composition.

BRIEF DESCRIPTION OF THE DRAWINGS

Other objects and aspects of the invention will become apparent from the following description of embodiments with reference to the accompanying drawings in which.

TECHNICAL SOLUTION

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Hereinafter, the invention will be described in detail, especially, in view of technical construction thereof in conjunction with the accompanying drawings.

Figure 1:
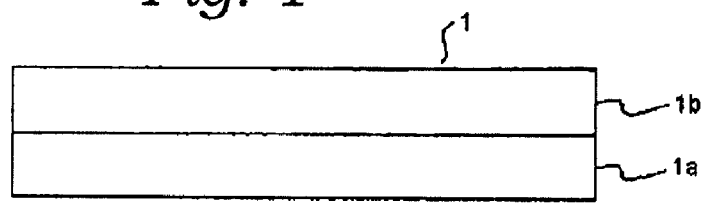
FIG. 1 illustrates a structure of a positive type photoresist resin film according to the invention.

FIG. 1 shows a positive type photoresist resin film that includes a support film 1a and a positive type photoresist resin layer 1b laminated over the support film 1a. Occasionally, in order to improve safety of storage and transportation of the positive type photoresist resin film according to the invention, the film further includes a protective layer (not shown) over the photoresist resin layer 1b. The positive type photoresist resin layer 1b may include an alkali soluble resin, a diazide based photosensitive compound, and a sensitivity enhancer. The positive type photoresist resin layer 1b may optionally include a plasticizer and/or a high-boiling point solvent that can act as a plasticizer.

The positive type photoresist resin film with a laminated structure can eliminate spin-coating the photoresist onto a glass substrate, which is required when a conventional liquid photoresist resin composition is used, thereby solving problems such as thickness deviation during coating, poor smoothness, distortion, coagulation, foaming, solvent output, etc. Utilizing a dry film resist additionally advantageously enhances product yield.

One of the properties of the support film 1a of FIG. 1 is a peak height (Rp).

The peak height (Rp) is defined as a height difference between a mean height of surface (MHt) and a height of a highest surface peak (q) located in the height profile(direction of z axis) of the selected area.

Hereinafter we refer the "peak height (Rp)" to "Rp".

Also, the mean height of surface (MHt) is defined as an average height of all the top peaks, bottom valleys and anomalous peaks located in the height profile(direction of z axis) of the selected area if anomalous peaks were present in the surface.

Figure 2:
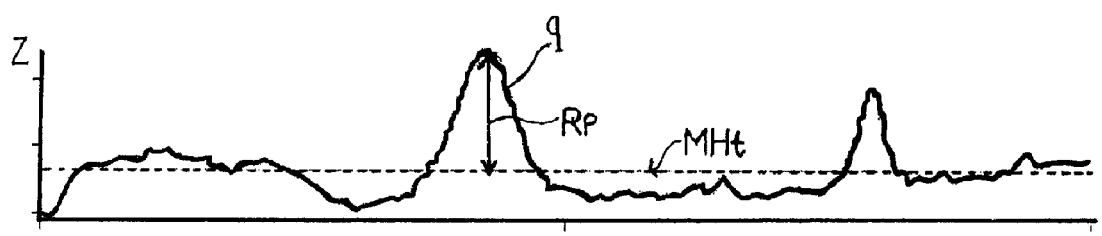
FIG. 2 shows a conventional substrate film with a large anomaly.
Figure 3:
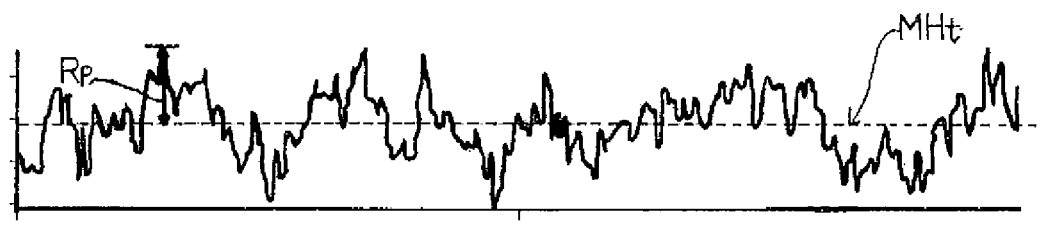
FIG. 3 shows a substrate film without a large anomaly.

FIG. 2 shows the surface with large anomalies of one type of support film 1a of FIG. 1.

In this case an anomalous peak q can be observed. The effect of this anomalous peak q would be to increase the value for Rp, even though the surface has low height of top peaks and bottom valleys in areas removed from the anomalous peak q.

Also, the presence of an anomaly q can be quite disadvantageous to the properties of a photoresist film formed on the support film 1a of FIG. 1. When the thickness of the photoresist film is large, the effect of a peak of the support film is minimal. However, as the photoresist film becomes thinner, the projection of a surface anomaly into the photoresist will cause the photoresist resin layer 1b of FIG. 1 to become non-uniform to result in the phenomena referred to as "fish eye". That is, as the photoresist resin layer 1b of FIG. 1 is reduced to a thickness of about 10 µm, the presence of large anomalies in the support film 1a of FIG. 1 will tend to result in fish eye formation. As a result, the peak height (Rp) of the support film 1a of FIG. 1 should be not more than about 300 nm.

Also, the peak height (Rp) of the support film 1a of FIG. 1 may preferably be about 100 nm or less, although the invention is still effective at a peak height(Rp) of 30 nm (0.03 µm). Also, the peak height (Rp) is ideally reduced as much as is possible, even to 10 nm (0.01 µm) or less. However, a working range for the peak height (Rp) is from 15 to 30 nm.

Figure 4:
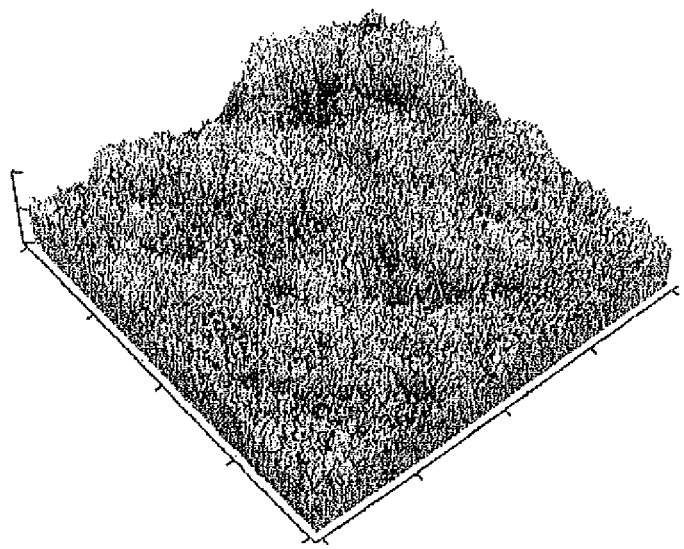
FIG. 4 shows an atomic force microscopy (AFM) micrograph of a substrate film without large anomalies.
Figure 5:
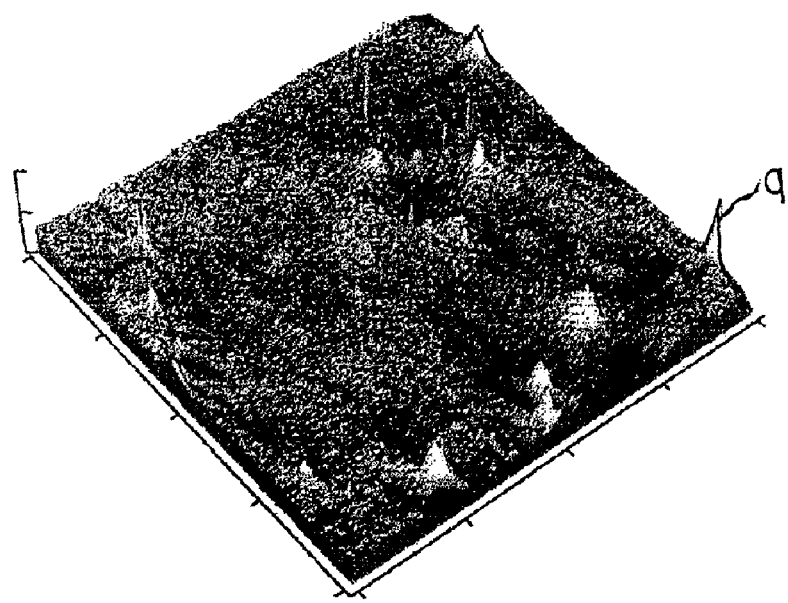
FIG. 5 shows an AFM micrograph of a conventional substrate film with large anomalies.

FIG. 4 shows the surface of an oriented polypropylene (OPP) support film that is relatively free from large anomalies taken by atomic force microscopy (AFM). Here, the surface is relatively free from large anomalous peaks that can cause defect in the photoresist layer. In contrast, FIG. 5 shows an AFM micrograph of a polyethylene terephthalate (PET) film that shows the presence of large peaks rising above the mean height of surface (MHt). When these large peaks project into the photoresist layer, disadvantageous defect can result.

More particularly, the support film of the invention preferably has a peak height (Rp), defined a height difference between a mean height of surface (MHt) and height of the highest surface peak (q) located in the height profile(direction of z axis) of the selected area, of not more than about 300 nm by measuring with Atomic Force Microscope (AFM). The peak height (Rp) is more preferably not more than about 100 nm, which may be attained when an OPP or biaxial OPP (BOPP) film is used.

The mean height of surface (MHt) and peak height (Rp) are measured by Atom Force Microscope (AFM, Model: Auto prove M5) made by Park Scientific Instrument company of USA.

The Atom Force Microscope (AFM) generates attractive force or repulsive force according to lengthwise interval between atom of detector and atom of sample surface when micro detector fixed cantilever of AFM comes near to the surface of the supporting film.

By the above-mentioned phenomenon, the mean height of surface (MHt) and peak height (Rp) can be measured.

More detailedly, the area of measuring (sample size) is defined as 20×20 µm$^2$.

The detector of AFM is contacted with the ten location selected optionally of the support film surface and the generated force of atom is measured by photodiode.

The mean height of surface (MHt) and peak height (Rp) are obtained by analyzing the generated force of atom measured by photodiode with second order fit using software (Thermo Microscopes proscan software version 2.0).

At this time, Rp is an average of eight measured values excluding the maximum value and minimum value from the ten measured values.

If the Rp exceeds 300 nm, there may be a dimple or fish eye equal to the height of the highest surface peak on the surface of the photoresist layer when the substrate film is released from the photoresist layer after laminating the dry film resist, so that it causes a defect during development, after exposing the film to light.

Additionally, the highest surface peak is also formed because of the particles added (such as organic particles or inorganic particles) to improve smooth running properties in production of film, and/or other impurities generated during production of film.

The support film 1a of the invention should have satisfactory physical properties for the positive type photoresist resin film. Examples of suitable support film materials include, but are not restricted to, polycarbonate film, polyethylene (PE) film, polypropylene (PP) film, oriented polypropylene (OPP) film, polyethylene terephthalate (PET) film, polyethylene naphthalate (PEN) film, ethylene vinyl acetate (EVA) film, polyvinyl film, any suitable polyolefin film, epoxy film and the like. Particularly preferable polyolefin film is polypropylene (PP) film, polyethylene (PE) film, ethylene vinyl acetate (EVA) film, etc. A preferable polyvinyl film is polyvinyl chloride (PVC) film, polyvinyl acetate (PVA) film, polyvinyl alcohol (PVOH) film, etc. Particularly preferable polystyrene films are polystyrene (PS) film, acrylonitrile/butadiene/styrene (ABS) film, etc. Particularly, the support film is preferably transparent to allow light to pass through the support film and irradiate the photoresist resin layer.

The support film 1a of FIG. 1 may preferably have a thickness ranging from about 10 to 50 mm to serve as a framework for supporting shape of the positive type photoresist resin film, preferably a thickness ranging from about 15 to 50 mm, more preferably a thickness ranging from about 15 to 25 mm.

Next, the following discussion covers various ingredients of the positive type photoresist resin layer 1b according to the invention.

Generally speaking, resin materials can be thermoplastic or thermosetting. Thermoplastic is a type of plastic or resin that will repeatedly soften when heated and harden when cooled. The thermoplastic plastic can be molded and shaped when heated, keeping its shape when cool. A thermosetting resin or plastic is a material that will undergo or has already undergone a chemical reaction through heat and/or catalysts to form a solid. Once the thermosetting material has been heated, it does not go back to its original state and does not soften when reheated.

The alkali soluble resin used to prepare the positive type photoresist resin layer 1b of the invention preferably includes, but is not limited to, novolac resin as a condensation product of phenols and aldehydes and, most preferably cresol novolac resin.

Novolac resin is obtained by polycondensation of phenols alone or in combination with aldehydes and an acidic catalyst according to known reaction mechanisms.

Phenols include, but are not limited to, primary phenols such as phenol, o-cresol, m-cresol, p-cresol, 2,3-xylenol, 2,5-xylenol, 3,4-xylenol, 3,5-xylenol, 2,3,5-trimethylphenol-xylenol, 4-t-butylphenol, 2-t-butylphenol, 3-t-butylphenol, 4-methyl-2-t-butylphenol and the like; and polyhydric phenols such as 2-naphthol, 1,3-dihydroxy naphthalene, 1,7-dihydroxy naphthalene, 1,5-dihydroxyl naphthalene, resorcinol, pyrocatechol, hydroquinone, bisphenol A, phloroglucinol, pyrogallol and the like, which may be used alone or in combination. A combination of m-cresol and p-cresol is particularly preferred.

Suitable aldehydes include, but are not limited to, formaldehyde, trioxane, paraformaldehyde, benzaldehyde, acetaldehyde, propylaldehyde, phenylacetaldehyde, α or β-phenyl propylaldehyde, o-, m- or p-hydroxybenzaldehyde, glutaraldehyde, terephthalaldehyde and the like and may be used alone or in combination.

The cresol novolac resin for use in the invention preferably has a weight average molecular weight (based on GPC) ranging from about 2,000 to 30,000.

In addition, the cresol novolac resin for use in the invention preferably has a meta/para-cresol content in a mixing ratio by weight ranging from about 4:6 to 6:4, since the resin has varied physical properties such as photosensitizing speed and film residual rate dependent on the mixing ratio of the meta/para-cresol content.

If the meta-cresol content among the cresol novolac resin exceeds the above range, the photosensitizing speed becomes higher while the film residual rate is rapidly lowered. On the other hand, the photosensitizing speed becomes unfavorably slow when the para-cresol content exceeds the above range.

Although a cresol novolac resin having a meta/para-cresol content in the mixing ratio by weight ranging from about 4:6 to 6:4 can be used alone, more preferably used are resins with different molecular weights in combination. In this case, the cresol novolac resin is preferably a mixture of (i) cresol novolac resin having a weight average molecular weight (based on GPC) ranging from about 8,000 to 30,000 and (ii) cresol novolac resin having a weight average molecular weight (based on GPC) ranging from about 2,000 to 8,000 in a mixing ratio ranging from about 7:3 to 9:1.

The term "weight average molecular weight" used herein refers to a conversion value of polystyrene equivalent determined by Gel Permeation Chromatography (GPC). If the weight average molecular weight is less than about 2,000, the photoresist resin film exhibits a dramatic thickness reduction in unexposed regions after development of the film. On the other hand, when the weight average molecular weight exceeds about 30,000, the development speed is lowered thereby reducing sensitivity. The novolac resin of the invention can achieve the most preferable effects when a resin obtained after removing low molecular weight ingredients present in the reaction product has a weight average molecular weight within the range (of about 2,000 to 30,000). In order to remove the low molecular weight ingredients from the novolac resin, conventional techniques known in the art including fractional precipitation, fractional dissolution, column chromatography and the like may be conveniently employed. As a result, performance of the photoresist resin film is improved, especially, scumming, thermal resistance, etc.

As an alkali soluble resin, the novolac resin can be dissolved in an alkaline solution without increase in volume and provides images exhibiting high resistance to plasma etching when the resin is used as a mask for the etching.

The diazide based photosensitive compound of the invention is used as a photosensitive material and, in addition, acts as a dissolution inhibitor to reduce alkali-solubility of the novolac resin. However, the diazide based photosensitive compound is converted into an alkali-soluble material when irradiated with light, thereby serving to increase the alkali-solubility of the novolac resin. Accordingly, the photosensitive compound is particularly useful for the positive type photoresist resin film due to alteration in solubility caused by light irradiation.

The diazide based photosensitive compound may be synthesized by esterification between a polyhydroxy compound and a quinonediazide sulfonic compound. The esterification for synthesizing the photosensitive compound comprises: dissolving the polyhydroxy compound and the quinonediazide sulfonic compound in a solvent such as dioxane, acetone, tetrahydrofuran, methylethylketone, N-methylpyrolidine, chloroform, trichloroethane, trichloroethylene or dichloroethane; condensing the prepared solution by adding a basic catalyst such as sodium hydroxide, sodium carbonate, sodium hydrogen carbonate, triethylamine, N-methyl morpholine, N-methyl piperazine or 4-dimethyl aminopyridine to the solution; and washing, purifying and drying the resulting product. Desirable isomers can be selectively esterified and the esterification rate (average esterification rate) is not specifically limited, but is preferably in the range of about 20 to 100% and more preferably about 60 to 90% in terms of the esterification of the diazide sulfonic compound to OH groups of a polyhydroxy compound. When the esterification rate is too low, pattern structure and resolution are deteriorated. In contrast, deterioration of sensitivity occurs if the esterification rate is too high.

The quinonediazide sulfonic compound includes, for example, o-quinone diazide compounds such as 1,2-benzoquinone diazide-4-sulfonic acid, 1,2-naphthoquinone diazide-4-sulfonic acid, 1,2-benzoquinone diazide-5-sulfonic acid and 1,2-naphthoquinone diazide-5-sulfonic acid; and other quinone diazide sulfonic derivatives. The diazide based photosensitive compound is preferably at least of 1,2-benzoquinone diazide-4-sulfonic chloride, 1,2-naphthoquinone diazide-4-sulfonic chloride and 1,2-naphthoquinone diazide-5-sulfonic chloride.

The quinonediazide sulfonic compound functions as a dissolution inhibitor to decrease the solubility of novolac resin in alkaline solutions. However, the compound decomposes to produce alkali soluble resin during an exposure process and, thereby, has a characteristic of accelerating the dissolution of novolac resin in an alkaline solution.

As the polyhydroxy compound, preferred examples are trihydroxybenzophenones such as 2,3,4'-trihydroxy benzophenone; 2,2',3-trihydroxy benzophenone, 2,3,4'-trihydroxy benzophenone; tetrahydroxybenzophenones such as 2,3,4,4-tetrahydroxybenzophenone, 2,2',4,4'-tetreahydroxybenzophenone, 2,3,4,5-tetrahydroxybenzophenone; pentahydroxy benzophenones such as 2,2',3,4,4'-pentahydroxybenzophenone, 2,2',3,4,5-pentahydroxybenzophenone; hexahydroxybenzophenones such as 2,3,3',4,4,5'-hexahydroxybenzophenone, 2,2,3,3',4,5'-hexahydroxybenzophenone; gallic alkylester; oxyflavans, etc.

The diazide based photosensitive compound for use in the invention is preferably at least one selected from 2,3,4,4-tetrahydroxybenzophenone-1,2-naphthoquinonediazide-sulfonate, 2,3,4-trihydroxybenzo phenone-1,2-naphthoquinonediazide-5-sulfonate and (1-[1-(4-hydroxyphenyl)isopropyl]-4-[1,1-bis(4-hydroxyphenyl)ethyl]benzene)-1,2-naphtho quinonediazide-5-sulfonate. Also, the diazide based photosensitive compound prepared reacting polyhydroxybenzophenone and a diazide based compound such as 1,2-naphto quinonediazide, 2-diazo-1-naphthol-5-sulfonic acid may be used.

The diazide based photosensitive compound is described in Chapter 7 of Light Sensitive Systems, Kosar, J.; John Wiley & Sons, New York, 1965.

Such diazide based photosensitive compounds (that is, sensitizer) used as a constitutional ingredient of the positive type photoresist resin layer according lo the invention are selected from substituted naphthoquinone diazide based sensitizers generally employed in positive type photoresist resin compositions, which is disclosed in, for example, U.S. Pat. Nos. 2,797,213; 3,106,465; 3,148,983; 3,201,329; 3,785,825; and 3,802,885, etc The diazide based photosensitive compound described above is used alone or in combination in an amount of about 30 to 80 parts by weight, based on about 100 parts by weight of the alkali soluble resin. If less than about 30 parts by weight of the diazide based photosensitive compound is used, the compound does not undergo development in a developing solution and exhibits drastically reduced residual rate of the photoresist film. In contrast, if the amount exceeds about 80 parts by weight, costs are too high, thus being economically disadvantageous and, in addition, the solubility in the solvent becomes lower.

Such a diazide based photosensitive compound is capable of controlling photosensitizing speed of the positive type photoresist resin film according to the invention by procedures including, for example, the control of amount of the photosensitive compound and the control of esterification between the polyhydroxy compound such as 2,3,4-trihydroxybenzophenone and the quinonediazide sulfonic compound such as 2-diazo-1-naphthol-5-sulfonic acid.

The diazide based photosensitive compound reduces the solubility of alkali soluble resin in an aqueous alkali developing solution to about ¹⁄₁₀₀th that prior to exposure. However, after the exposure, the compound is converted into a carboxylic acid soluble in the alkaline solution, thereby exhibiting a solubility increase of about 1000 to 1500 fold, compared to non-exposed positive type photoresist compositions. The above characteristic is preferably employed in formation of micro-circuit patterns for devices such as LCDs, organic ELDs and the like. More particularly, a photoresist applied over a silicone wafer or a glass substrate is subjected to UV irradiation through a semi-conductor mask in a circuit form, and then, is treated using the developing solution, resulting in a desired circuit pattern remaining on the silicone wafer or the glass substrate.

A sensitivity enhancer may be used for improving the sensitivity of the positive type photoresist resin film. The sensitivity enhancer comprises a polyhydroxy compound which contains about 2 to 7 phenol based hydroxyl groups and has a weight average molecular weight less than about 1,000 relative to polystyrene. Preferred examples are at least one selected from 2,3,4-trihydroxybenzophenone, 2,3,4,4-tetrahydroxybenzophenone or 1-[1-(4-hydroxyphenyl)isopropyl]-4-[1,1-bis(4-hydroxyphenyl)ethyl]benzene.

The polyhydroxy compound serving as the sensitivity enhancer is preferably used in an amount of about 3 to 15 parts by weight based on about 100 parts by weight of the alkali soluble resin. If less than about 3 parts by weight of the polyhydroxy compound is used, it exhibits insignificant photosensitizing effects and unsatisfactory resolution and sensitivity. When the amount exceeds about 15 parts by weight, it exhibits high sensitivity but narrows window processing margin.

In one embodiment of the invention, the positive type photoresist resin layer 1b includes a high-boiling point solvent (first solvent) having a boiling point sufficiently high such that a second solvent (low-boiling point solvent) can be removed from the composition by heating while the first solvent is substantially retained in the composition.

The difference of boiling point between the first solvent and the second solvent is not less than 30° C., more preferably not less than 50° C.

The first solvent and the second solvent is at least one selected from the group consisting of ethyl acetate, butyl acetate, ethyleneglycol monoethylether acetate, diethyleneglycol monoethylether acetate and propyleneglycol monoethylether acetate, acetone, methylethyl ketone, ethyl alcohol, methyl alcohol, propyl alcohol, isopropyl alcohol, benzene, toluene, cyclopentanone, cyclohexanone, ethylene glycol, xylene, ethyleneglycol monoethylether and diethyleneglycol monoethylether.

However, the first solvent (high-boiling point solvent) are not restricted, and any appropriate solvent or mixture of solvents can be used.

This high-boiling point solvent acts as a plasticizer in the positive type photoresist resin layer to reduce brittleness, which is one of the physical properties innate to positive type photoresist resin films, thereby resulting in improvement of film formation and lamination properties in further processes.

The high-boiling point solvent reinforces adhesion to the substrate while evaporating when the positive type photoresist resin film is laminated on a glass substrate, the supporting film is released from the resin film, and the released photoresist resin undergoes a baking process.

The first solvent (high-boiling point solvent) solvent has a boiling point of not less than 100° C. and the second solvent has a boiling point of less than 100° C.

Preferred examples of the first solvent are at least one selected from group consisting of toluene, butyl acetate, cyclopentanone, ethyleneglycol monoethylether, xylene, cyclohexanone, ethylene glycol, diethyleneglycol monoethylether, ethyleneglycol monoethylether acetate, diethyleneglycol monoethylether acetate and propyleneglycol monoethylether acetate.

However, the high-boiling point solvents are not restricted, and any appropriate solvent or mixture of solvents can be used.

The content of the high-boiling point solvent preferably ranges from about 30 to 120 parts by weight based on 100 parts by weight of the alkali soluble resin. Another preferable range of the high-boiling point solvent is about 50 to 100 parts by weight based on 100 parts by weight of the alkali soluble resin. If less than about 30 parts by weight of the high-boiling point solvent is used, the photoresist resin layer may exhibit less improvement in the film formation and the lamination properties. If the content exceeds about 120 parts by weight, the photoresist resin layer becomes too sticky and poor.

The positive type photoresist resin composition may be considered to be different from the positive type photoresist resin layer, in part, by the addition of a low-boiling point solvent.

The low-boiling point solvent used in forming the positive type photoresist resin composition may be evaporated at a constant speed to form a homogeneous and soft coating film after evaporation, and preferably includes at least one ketone solvents having a boiling point less than about 100° C.

However, the low-boiling point solvent for use in the invention is not specifically restricted and may further include, for example, at least one of acetone, methyl alcohol, ethyl acetate, methylethyl ketone, benzene and isopropyl alcohol alone or in combination thereof in any relative ratio. It may be noted that some solvents may be utilized as either a low-boiling point solvent or a high-boiling point solvent, depending upon the relative boiling point temperatures when the solvents are selected.

The low-boiling point solvent is employed to homogeneously blend the various ingredients of the photoresist resin composition and to control the viscosity of the composition sufficient to be easily applied to the supporting film. The low-boiling point solvent is preferably used in the range of about 150 to 400 parts by weight based on 100 parts by weight of the alkali soluble resin. An alternate preferred range of low-boiling point solvent is about 200 to 300 parts by weight based on 100 parts by weight of the alkali soluble resin.

Furthermore, the positive type photoresist resin layer of the invention may further include a releasing agent to improve release properties of the supporting film after lamination, other than the above ingredients. Preferred examples of the releasing agent are silicon resin, fluorine resin, olefin resin, wax, etc. Among these, particularly preferable is a fluorine resin with a viscosity ranging from about 1,000 to 10,000 cps.

The content of the releasing agent preferably ranges from about 0.5 to 4 parts by weight based on 100 parts by weight of the alkali soluble resin.

When the support film 1a of FIG. 1 is an oriented polypropylene (OPP) film, the releasing agent are not added to the positive type photoresist resin layer because the oriented polypropylene (OPP) film has excellent releasing property due to its hydrophobic property.

But the support film 1a of FIG. 1 is a polyethylene terephthalate (PET) film, the releasing agent are added to the positive type photoresist resin layer because the polyethylene terephthalate (PET) film has poor releasing property due to its hydrophilic property.

In addition to the above constitutional composition, generally known components such as other additives including leveling agents, dyes, pigments, surfactants, fillers and the like for use in conventional photoresist resin compositions may, of course, be included in the positive type photoresist resin layer according to the invention.

In accordance with the invention, the positive type photoresist resin layer 1b is prepared by mixing a composition containing the alkali soluble resin, the diazide based photosensitive compound and the sensitivity enhancer, all of which are described above, with a constant amount of solvent, including a high-boiling point solvent and a low-boiling point solvent, and applying the mixture to the support film 1a of FIG. 1 at a thickness of about 5 to 100 μm.

The process to form the positive type photoresist resin layer on the support film includes coating the support film with inventive composition and solvent(s) by way of generally known coating methods using a roller, roll coater, gravure, meyer rod, sprayer, etc.; and drying the coated film to volatilize the solvent. If required, the applied composition may be treated by heating and curing.

The positive type photoresist resin film usually adheres to a surface of the substrate by lamination and is subjected to light irradiation prior to releasing the support film, followed by releasing the support film. Otherwise, after laminating the positive type resin film and releasing the support film, the positive type photoresist resin film may be subjected to light irradiation. However, irradiation can be performed either before or after the support film is removed.

Moreover, the prepared positive type photoresist resin film may further include a protective layer formed on top of the positive type photoresist resin layer. Such a protective layer serves to block air penetration and protect the positive type photoresist resin layer from impurities or contaminants and is preferably a polyethylene film, polyethylene terephthalate film, polypropylene film, etc. The protective layer preferably has a thickness ranging from about 15 to 30 μm.

Figure 6:
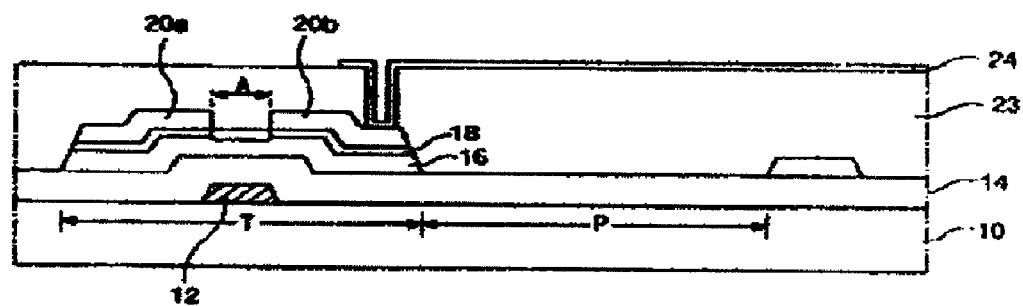
FIG. 6 shows a cross-sectional view illustrating a liquid crystal display device.

FIG. 6 illustrates a cross-sectional structure of an array substrate for a liquid crystal display device fabricated using four masks according to the invention.

First, a gate electrode 12 is formed over a lower substrate 10 by a first masking process and is sequentially laminated with a gate insulating film 14, an active layer 16 composed of amorphous silicon, an ohmic layer 18 composed of impurity amorphous silicon, and a metal layer.

Next, the second masking process using diffraction and partial exposure is applied to a region A in which a source electrode 20a and a drain electrode 20b are formed.

Subsequently, dry etching is conducted to form the active layer 16, the ohmic layer 18, the source electrode 20a and the drain electrode 20b, thereby resulting in a thin film transistor T.

An insulating layer 23 is deposited thereto, and then, is subjected to the third masking process to form a contact hole on top of the drain electrode 20b.

Then, a transparent conductive metal is deposited thereto, and then, is subjected to the fourth masking process to form a pixel electrode 24 which contacts to the drain electrode 20b through the contact hole, thereby completing an array board.

Next, a color filter layer and a black matrix (not shown) are formed on top of an upper substrate. More particularly, a common electrode is laminated on top of the upper substrate and combined with the lower substrate containing TFT and data wire lines. A liquid crystal layer is then placed between both substrates, thereby completing a liquid crystal display.

The array substrate described above may be formed using a photoresist film. The process for forming patterns using the inventive photoresist resin film may include:

(1) a step of forming the photoresist resin film, which is prepared by applying a photoresist resin layer to a support film, on a glass substrate and, optionally, releasing the support film from the photoresist resin film;

(2) a step of irradiating the prepared coating with UV irradiation through a mask or directly irradiating the prepared coating with UV irradiation not through a mask to generate a desired pattern; and (3) a step of forming a resist patterned coating which comprises removing the positive type photoresist resin coating in the UV irradiation portions by development after releasing the support film, in case that the support film was not released from the photoresist resin film.

A preferred example of the developing solution is about 2.38% tetramethyl-ammonium hydroxide (TMAH) for developing the positive type photoresist resin film according to the invention.

In step (1), adhering the positive type photoresist resin film to the substrate positions the photoresist resin layer close to the support film, thereby completing formation of the positive type photoresist resin coating. The support film need not be released. In addition, the photoresist resin coating formed on the substrate need not be dried.

Consequently, the desired resist patterned coating is formed through steps (1), (2) and (3).

The prepared positive type photoresist resin film having the photoresist resin layer on the support film solves problems such as reduced resolution or sensitivity during storage of the composition typically generated when using conventional liquid photoresist resin compositions, or eliminates the spin coating and/or drying processes conventionally required when applying a composition to the glass, silicon or other substrate, so that the invention can solve disadvantages of thickness deviation and foaming at the drying process, improve product yield and, especially, remarkably reduce processing costs.

The micro circuit pattern formed using the positive type photoresist resin film according to the invention exhibits high resolution on the order of about 2 to 7 μm, substantially similar or superior to that of a conventional liquid positive type photoresist resin composition, and therefore can be employed in fabrication of micro circuits such as LCDs, organic ELDs and the like.

However, when the above-described photoresist resin film is prepared, it may become difficult to produce the photoresist resin film since the composition has high Tg (glass transition temperature),which and inhibits release of the support film after lamination. That is, the adhesion properties of a high Tg material may prevent a clean release of the support film.

In the related art, U.S. Pat. No. 4,550,069 may mention the use of plasticizers as additives to positive photoresist, but this technology is used for conventional spin-coated resists and is not directed at the problem of clean removal of a substrate backing.

In the invention, the high-boiling point solvent functions as a plasticizer. However, another plasticizing compound can be added to the composition to act as an adjunct to the plasticizing effect of the low boiling point solvent. This adjunct plasticizer may be preferably at least one of dibutyl phthalate (DBP), dioctyl phthalate (DOP), dimethyl phthalate (DMP), polyethylene glycol (PEG) and silicone based oils. However, any suitable plasticizer can be used in the invention as an adjunct plasticizer to the low-boiling point solvent, including phthalates, sebacates, trimellitates, acetates, maleates, methyl diethanolamine (MDEA) and ethylene oxide derivatives. Among these, particularly preferable is a silicone based oil having a weight average molecular weight ranging from 1,400 to 4,600 with epoxy groups at both terminals thereof.

The content of the adjunct plasticizer may preferably range up to about 0.01 to 35 parts by weight based on 100 parts by weight of the alkali soluble resin.

In a preferred embodiment of the invention, the process for forming patterns using the inventive photoresist resin film may include:

(I) a step of forming the photoresist resin film, which is prepared by applying a photoresist resin layer to a supporting film, on a substrate and, optionally, releasing the supporting film from the photoresist resin film;

(II) a step of irradiating the prepared coating with UV irradiation through a mask or directly irradiating the prepared coating with WV irradiation not through a mask to generate a desired pattern; and (III) a step of forming a resist patterned coating which comprises removing the positive type photoresist resin coating in the UV irradiation portions by development after releasing the supporting film, in case that the supporting film was not released from the photoresist resin film.

Step (I) serves to form a positive type photoresist resin coating by adhering the positive type photoresist resin film to the substrate in order to position the photoresist resin layer close to the supporting film. Optionally, a baking process is needed before or after Step (II) to reinforce adhesion to the substrate so that the resist patterned coating is not washed out during development in Step (III). More particularly, prior to proceeding Step (II), the positive type photoresist resin coating is formed on the substrate, the supporting film is released from the photoresist resin film, and then, the released film is subjected to a baking process to reinforce the adhesiveness to substrate. Alternately, after proceeding with Step (II), the supporting film is released from the photoresist resin, and the released film is subjected to a baking process to reinforce the adhesiveness to substrate. That is, various iterations of heating steps can be performed as dictated by the requirements of the photoresist film and the complexity and boiling point differentials of the solvent system.

Consequently, the desired resist patterned coating is formed through steps (I), (II) and (III).

The prepared positive type photoresist resin film having the photoresist resin layer on the supporting film solves problems such as reduced resolution or sensitivity during storage of the composition typically generated when using conventional liquid photoresist resin compositions, or solves problems such as thickness deviation and foaming at the drying process and improves product yield.

MODE FOR THE INVENTION

Examples

The above described features and other advantages of the present invention will become more apparent from the following non-restrictive examples. However, it should be understood that these examples are intended to illustrate the invention more fully as practical embodiments and do not limit the scope of the present invention.

Example 1

A solution was prepared that included a cresol novolac resin as an alkali soluble resin; 34 parts by weight of 1,2-naphthoquinone-2-diazide-5-sulfonic chloride as the photosensitive compound; 3.5 parts by weight of 2,3,4-trihydroxybenzophenone as the sensitivity enhancer; 165 parts by weight of methylethyl ketone as the low-boiling point solvent; 55 parts by weight of diethyleneglycol monoethylether acetate as the high-boiling point solvent; and 0.5 parts by weight of fluorine based silicon resin as the releasing agent based on 100 parts by weight of the above alkali soluble resin. The prepared solution was filtered through a 0.2 μm Millipore Teflon filter to remove insoluble materials. The resultant solution was applied to a polyethyleneterephthalate (PET) supporting film (19 μm thickness) at a thickness of 5 μm to form a photoresist resin layer, thereby producing a positive type photoresist resin film.

Next, the obtained positive type photoresist resin film was adhered to a glass substrate with lamination speed of 2 m/min, at 110° C. and under a heating roller pressure of 70 psi such that the positive type photoresist resin layer was positioned on a surface of the glass substrate. The polymer supporting film was released from the photoresist resin film adhered to the surface of the glass substrate, the positive type photoresist resin layer was baked on a hot plate at 100° C. for 120 seconds, exposed to UV irradiation using a photomask, subjected to development in 2.38% tetramethyl-ammonium hydroxide (TMAH) alkali developer for 120 seconds, and washed and dried for 30 seconds to remove exposed portions in the positive type photoresist resin layer, resulting in formation of a micro-pattern.

The physical properties of the formed pattern were evaluated according to the following methods and the results are shown in Table 1.

Example 2

A solution was prepared that included a cresol novolac resin as the alkali soluble resin; 34 parts by weight of 1,2-naphthoquinone-2-diazide-5-sulfonic chloride as the photosensitive compound; 3.5 parts by weight of 2,2'4,4'-tetrahydroxybenzophenone as the sensitivity enhancer; 165 parts by weight of methylethyl ketone as the low-boiling point solvent; 55 parts by weight of diethyleneglycol monoethylether acetate as the high-boiling point solvent; and 0.5 parts by weight of fluorine based silicon resin as the releasing agent based on 100 parts by weight of the above alkali soluble resin. The prepared solution was filtered through a 0.2 μm Millipore Teflon filter to remove insoluble materials. The resultant solution was applied to a polyethylene terephlalate (PET) supporting film (19 μm thickness) in a thickness of 5 μm to form a photoresist resin layer 1b, thereby producing a positive type photoresist resin film.

Next, the obtained positive type photoresist resin film was adhered to a glass substrate with lamination speed of 2 m/min, at 110° C. and under a heating roller pressure of 70 psi such that the positive type photoresist resin layer was positioned on a surface of the glass substrate. The polymer supporting film was released from the photoresist resin film adhered to the surface of the glass substrate, the positive type photoresist resin layer was baked on a hot plate at 100° C. for 120 seconds, exposed to UV irradiation using a photomask, subjected to development in 2.38% TMAH alkali developer for 120 seconds, and washed and dried for 30 seconds to remove exposed portions in the positive type photoresist resin layer, resulting in formation of a micro-pattern.

The physical properties of the formed pattern were evaluated according to the following methods and the results are shown in Table 1.

Example 3

A solution was prepared that included a cresol novolac resin as the alkali soluble resin; 34 parts by weight of 1,2-naphthoquinone-2-diazide-4-sulfonic chloride as the photosensitive compound; 3.5 parts by weight of 1-[1(4-hydroxyphenyl)isopropyl]-4-[1,1-bis(4-hydroxyphenyl)ethyl] benzene as the sensitivity enhancer; 165 parts by weight of methylethyl ketone as the low-boiling point solvent; 55 parts by weight of diethyleneglycol monoethylether acetate as the high-boiling point solvent; and 0.5 parts by weight of fluorine based silicon resin as the releasing agent based on 100 parts by weight of the above alkali soluble resin. The prepared solution was subjected to filtering through a 0.2 μm Millipore Teflon filter to remove insoluble materials. The resultant solution was applied to a polyethylene terephthalate (PET) supporting film (19 μm thickness) in a thickness of 5 μm to form a photoresist resin layer, thereby producing a positive type photoresist resin film.

Next, the obtained positive type photoresist resin film was adhered to a glass substrate with lamination speed of 2 m/min, at 110° C. and under a heating roller pressure of 70 psi such that the positive type photoresist resin layer was positioned on a surface of the glass substrate, the polymer supporting film was released from the photoresist resin film adhered to the surface of the glass substrate, the positive type photoresist resin layer was baked on a hot plate at 100° C. for 120 seconds, exposed to UV irradiation using a photomask, subjected to development in 2.38% TMAH alkali developer for 120 seconds, and washed and dried for 30 seconds to remove exposed portions in the positive type photoresist resin layer, resulting in formation of a micro-pattern.

Example 4

A positive type photoresist film was prepared in the manner as Example 1, except that supporting film was an oriented polypropylene (OPP) film with thickness of 30 μm and releasing agent was not added to the solution.

Example 5

A positive type photoresist film was prepared in the manner as Example 2, except that supporting film was an oriented polypropylene (OPP) film with thickness of 30 μm and releasing agent was not added to the solution.

Example 6

A positive type photoresist film was prepared in the manner as Example 3, except that supporting film was an oriented polypropylene (OPP) film with thickness of 30 μm and releasing agent was not added to the solution.

TABLE 1

Comparison of thermal and mechanical properties in the support film.

| Physical properties | OPP | PET |
|---|---|---|
| Thickness (μm) | 30 | 19 |
| Melting point (° C.) | 171.4 | 251.4 |

(PET physical properties mean physical properties of PET used in Examples 1 to 3, OPP physical properties mean physical properties of OPP used in Example 4 to 6)

TABLE 2

Measuring results for MHt and Rp of PET support film used in Example 1 to 3. [μm]

| Region Group | Rp-v | Rms rough | Ave rough | MHt | Rp | Valley (Rv) |
|---|---|---|---|---|---|---|
| PET-1 | 0.2322 | 0.0112 | 0.0072 | 0.0732 | 0.1590 | −0.0732 |
| PET-2 | 0.4342 | 0.0210 | 0.0101 | 0.2584 | 0.1757 | −0.2584 |
| PET-3 | 0.1724 | 0.0065 | 0.0037 | 0.0444 | 0.1280 | −0.0444 |
| PET-4 | 0.2009 | 0.0131 | 0.0088 | 0.0613 | 0.1396 | −0.0613 |
| PET-5 | 0.1340 | 0.0053 | 0.0034 | 0.0336 | 0.1003 | −0.0336 |
| PET-6 | 0.1161 | 0.0040 | 0.0025 | 0.0249 | 0.0913 | −0.0249 |
| PET-7 | 0.1602 | 0.0046 | 0.0024 | 0.0415 | 0.1187 | −0.0415 |
| PET-8 | 0.1378 | 0.0059 | 0.0030 | 0.0420 | 0.0958 | −0.0420 |
| Average | 0.1985 | 0.0089 | 0.0051 | 0.0724 | 0.1260 | −0.0724 |

TABLE 3

Measuring results for MHt and Rp of BOPP support film used in Example 4~6. [μm]

| Region Group | Rp-v | Rms rough | Ave rough | MHt | Rp | Valley (Rv) |
|---|---|---|---|---|---|---|
| OPP-1 | 0.0804 | 0.0077 | 0.0061 | 0.0322 | 0.0482 | −0.0322 |
| OPP-2 | 0.0789 | 0.0080 | 0.0063 | 0.0343 | 0.0446 | −0.0343 |
| OPP-3 | 0.1198 | 0.0081 | 0.0061 | 0.0461 | 0.0737 | −0.0461 |
| OPP-4 | 0.1438 | 0.0084 | 0.0063 | 0.0480 | 0.0958 | −0.0480 |
| OPP-5 | 0.0650 | 0.0064 | 0.0050 | 0.0272 | 0.0378 | −0.0272 |
| OPP-6 | 0.1028 | 0.0099 | 0.0076 | 0.0479 | 0.0549 | −0.0479 |
| OPP-7 | 0.0759 | 0.0069 | 0.0054 | 0.0288 | 0.0471 | −0.0288 |
| OPP-8 | 0.0728 | 0.0075 | 0.0059 | 0.0321 | 0.0407 | −0.0321 |
| Average | 0.0924 | 0.0079 | 0.0061 | 0.0371 | 0.0554 | −0.0371 |

In the Table 2~3, Rp-v is a distance between maximum peak height and minimum valley height located in the height profile (direction of z axis) of the selected area.

Rms rough is a standard derivation of data with 8 numbers against mean height of surface (MHt) and Ave rough is an average derivation of data with 8 numbers against mean height of surface (MHt).

Valley (Rv) is a distance between minimum valley height and mean height of surface (MHt) located in the height profile (direction of z axis) of the selected area.

Definition of Rp and MHt are already described.

Comparative Example 1

A solution to form a photoresist resin layer was prepared by blending 18.23% by weight of a cresol novolac resin as the alkali soluble resin, 6.17% by weight of the photosensitive compound containing 1,2-naphthoquinone diazide-4-sulfonic polyhydroxybenzophenone ester, 74.19% by weight of propyleneglycol monoethylether acetate as the solvent and 1.0% by weight of 2,2'4,4'-tetrahydroxybenzophenone as the sensitivity enhancer, and adding 0.41% by weight of a dye to the blend; and agitating the resultant mixture for 2 hours.

The prepared photoresist resin composition was applied to a glass substrate with a size of 10 cm×10 cm using spin-coating in a thickness of 1.5 μm. The coated substrate was exposed to UV irradiation using a photomask, subjected to development in 2.38% TMAH alkali developer for 120 seconds, and washed and dried for 30 seconds, resulting in formation of a micro-pattern.

The physical properties of the formed patterns were evaluated according to the following methods and the results are shown in Table 4.

Evaluation of Physical Properties

Physical properties of the support film used in the invention were evaluated according to the following methods.

[Melting Point]

Melting point of the prepared film is measured through difference in heat flow using a differential scanning calorimeter to apply the same temperature program to a sample and inert reference material.

[Height of Protrusion]

The prepared film is subjected to analysis of interatomic repulsive force with a micro probe using AFM three times, thereby calculating mean value of the highest surface point and the lowest surface point and determining surface toughness of the film.

[Film Release Properties]

After lamination of the prepared positive type photoresist dry film onto a glass substrate coated with ITO to a depth of 2000 and a width of 100×1000 at a lamination speed of 2 m/min, at a temperature of 110° C. under a heating roller pressure of 10 to 90 psi, the support film was peeled off from the photoresist layer. By evaluating release properties of the dry film using UTM (Universal Test Machine; Instron Inc.), peeling strength of the film during releasing was determined by UTM.

[Sensitivity]

After exposing the laminated substrate to light with varied light amount, the film was developed using 2.38% by mass of TMAH solution at ambient temperature for 60 seconds, washed for 30 seconds and then dried. Exposure amount of the resulting film was measured using an optical microscope.

[Thermal Resistance]

After formation of a resist pattern by the same manner for evaluating the sensitivity, the resist pattern was placed on a hot plate at 150° C. and subjected to heating for 2 minutes. A Scanning Electron Microscope (SEM) was used to observe cross-sections of the resist patterns while using a-step for observing surface of the resist pattern.

The condition of the resist patterns was evaluated as follows: "good" when variation in shape and surface of the resist pattern is not more than 3% after heating; "fair" for a variation ranging from 3 to 5%; and "poor" for a variation greater than 10%, relative to thickness of the pattern.

[Resolution]

After lamination of the prepared film onto the substrate at a lamination speed of 2.0 m/min, at a temperature of 110° C. and under a heating roller pressure of 10 to 90 psi the laminated film was subjected to UV irradiation using a photomask and peeling off PET film as the support film. Subsequently, the treated film was developed using 2.38% TMAH alkaline developer, thereby resulting in a micro circuit with unexposed regions. Resolution of the resultant micro circuit was observed using a scanning electron microscope.

[Film Formation]

After applying the resin composition to the supporting film, film formation was visibly observed and evaluated.

TABLE 4

| | Sensitivity (mJ/cm$^3$) | Resolution (μm) | Film formation | Film release properties (kg/100 × 100 mm$^2$) |
|---|---|---|---|---|
| Example 1 | 65.1 | 4.5 | ○ | 0.0686 |
| Example 2 | 63.2 | 5.2 | ○ | 0.0692 |
| Example 3 | 61.5 | 4.8 | ○ | 0.0729 |
| Example 4 | 64.0 | 4.3 | ○ | 0.0547 |
| Example 5 | 62.7 | 5.2 | ○ | 0.0561 |
| Example 6 | 60.8 | 4.7 | ○ | 0.0564 |
| Comparative Example 1 | 45.5 | 4.1 | X | X |

Compared to the use of conventional liquid photoresist resin compositions, the invention exhibits physical properties such as photosensitizing speed, development contrast, resolution, adhesiveness to a substrate, film residual rate, circuit line width uniformity (CD uniformity), etc. equal or superior to those of the conventional compositions in formation of micro-circuit patterns on a substrate used in devices such as LCDs, organic ELDs and the like. The invention can eliminate spin-coating processes and drying processes required in formation of micro-circuit patterns using conventional liquid photoresist resin compositions. Accordingly, the invention can solve typical problems of the above processes such as thickness deviation, poor smoothness, distortion, coagulation, foaming at drying and solvent output, etc., especially, can simplify the fabrication process since the spin-coating and drying processes are not required, thereby enhancing workability and economic benefit, as well as reducing loss of the photoresist resin composition to the minimum level.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

The invention claimed is:

1. A method for manufacturing an array for a display device comprising steps of:
    (a) adhering a positive dry film resist, which has a positive photoresist resin layer over a supporting film, to a substrate such that the positive photoresist resin layer adheres on a surface of the substrate, wherein the positive photoresist resin layer was formed from a composition comprising an alkali soluble resin, a diazide based positive photosensitive compound, a first solvent and a second solvent wherein the first solvent has a boiling point sufficiently high such that a second solvent can be removed from the composition by heating while the first solvent is substantially retained in the composition;
    (b) releasing the supporting film from the positive photoresist resin layer adhered to the surface of the substrate;
    (c) exposing the positive photoresist resin layer to light;
    (d) developing the positive photoresist resin layer in an alkali developer; and
    (e) washing and drying the positive photoresist resin layer for removing the exposed region in the positive photoresist resin layer, wherein
    (f) baking the positive photoresist resin layer for removing the first solvent in the positive photoresist resin layer is performed before said developing step (d).

2. The method according to claim 1, wherein said exposing step (c) is performed before said releasing step (b), and said baking step (f) is performed after said releasing step (b).

3. The method according to claim 1, wherein the difference of boiling point between the first solvent and the second solvent is not less than 30° C.

4. The method according to claim 3, wherein the first solvent is at least one selected from the group consisting of toluene, butyl acetate, cyclopentanone, ethyleneglycol monoethylether, xylene, cyclohexanone, ethylene glycol, diethyleneglycol monoethylether, ethyleneglycol monoethylether acetate, diethyleneglycol monoethylether acetate and propyleneglycol monoethylether acetate, and the second solvent is at least one selected from the group consisting of acetone, methyl alcohol, ethyl acetate, methylethyl ketone, benzene and isopropyl alcohol.

5. The method according to claim 1, wherein the difference of boiling point between the first solvent and the second solvent is not less than 50° C.

6. The method according to claim 1, wherein the first solvent and the second solvent respectively are at least one selected from the group consisting of ethyl acetate, butyl acetate, ethyleneglycol monoethylether acetate, diethyleneglycol monoethylether acetate and propyleneglycol monoethylether acetate, acetone, methylethyl ketone, ethyl alcohol, methyl alcohol, propyl alcohol, isopropyl alcohol, benzene, toluene, cyclopentanone, cyclohexanone, ethylene glycol, xylene, ethyleneglycol monoethylether and diethyleneglycol monoethylether.

7. The method according to claim 1, wherein the first solvent has a boiling point of not less than 100° C. and the second solvent has a boiling point of less than 100° C.

8. The method according to claim 1, wherein the positive photoresist resin layer comprises about 30 to 80 parts by weight of the diazide based positive photosensitive compound, and about 30 to 120 parts by weight of the first solvent, based on 100 parts by weight of the alkali soluble resin.

9. The method according to claim 8, wherein the alkali soluble resin is novolac resin.

10. The method according to claim 8, wherein the diazide based positive photosensitive compound is at least one selected from a group consisting of 1,2-benzoquinone diazide-4-sulfonic chloride, 1,2-naphthoquinone diazide-4-sulfonic chloride and 1,2-naphthoquinone diazide-5-sulfonic chloride.

11. The method according to claim 8, wherein the positive photoresist resin layer further comprises about 3 to 15 parts by weight of a sensitivity enhancer based on 100 parts by weight of the alkali soluble resin and the sensitivity enhancer is at least one selected from a group consisting of 2,3,4-trihydroxybenzophenone, 2,2'4,4'-tetrahydroxybenzophenone and (1-[1-(4-hydroxyphenyl)isopropyl]-4[1,1-bis(4-hydroxyphenyl)ethyl]benzene).

12. The method according to claim 8, wherein the positive photoresist resin layer further comprises a releasing agent.

13. The method according to claim 12, wherein the positive photoresist resin layer contains about 0.5 to 4 parts by weight of the releasing agent based on 100 parts by weight of the alkali soluble resin.

14. The method according to claim 12, wherein the releasing agent is fluorine based silicone.

15. The method according to claim 1, wherein said baking step (f) is performed before said exposing step (c).

* * * * *